United States Patent
Ke et al.

(10) Patent No.: US 8,703,571 B2
(45) Date of Patent: Apr. 22, 2014

(54) METHODS OF FABRICATING BIPOLAR JUNCTION TRANSISTORS HAVING A FIN

(75) Inventors: Po-Yao Ke, Dashe Township (TW); Tao-Wen Chung, Zhubei (TW); Shine Chung, San Jose, CA (US); Fu-Lung Hsueh, Cranbury, NJ (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/535,090

(22) Filed: Jun. 27, 2012

(65) Prior Publication Data

US 2012/0264269 A1 Oct. 18, 2012

Related U.S. Application Data

(63) Continuation of application No. 12/618,425, filed on Nov. 13, 2009, now Pat. No. 8,258,602.

(60) Provisional application No. 61/147,980, filed on Jan. 28, 2009.

(51) Int. Cl.
*H01L 21/331* (2006.01)

(52) U.S. Cl.
USPC .................. 438/338; 438/343; 257/E21.608

(58) Field of Classification Search
USPC ........................... 257/E21.608; 438/338, 343
See application file for complete search history.

(56) References Cited

U.S. PATENT DOCUMENTS

| | | | |
|---|---|---|---|
| 6,165,828 A | 12/2000 | Forbes et al. |
| 6,706,571 B1 | 3/2004 | Yu et al. |
| 6,762,479 B2 | 7/2004 | Groves et al. |
| 6,858,478 B2 | 2/2005 | Chau et al. |
| 7,056,781 B2 | 6/2006 | Yoon et al. |
| 7,190,050 B2 | 3/2007 | King et al. |
| 7,205,601 B2 | 4/2007 | Lee et al. |
| 7,247,887 B2 | 7/2007 | King et al. |
| 7,265,008 B2 | 9/2007 | King et al. |
| 7,482,672 B2 | 1/2009 | Cheng et al. |
| 7,508,031 B2 | 3/2009 | Liu et al. |
| 7,528,465 B2 | 5/2009 | King et al. |
| 7,605,449 B2 | 10/2009 | Liu et al. |
| 7,700,449 B2 | 4/2010 | Lee |
| 7,807,523 B2 | 10/2010 | Liu et al. |
| 7,939,862 B2 | 5/2011 | Moroz et al. |
| 7,960,232 B2 | 6/2011 | King et al. |
| 2006/0063334 A1 | 3/2006 | Donze et al. |
| 2007/0120156 A1 | 5/2007 | Liu et al. |
| 2008/0001234 A1 | 1/2008 | Cheng et al. |
| 2008/0290470 A1 | 11/2008 | King et al. |

*Primary Examiner* — Howard Weiss
(74) *Attorney, Agent, or Firm* — Slater & Matsil, L.L.P.

(57) ABSTRACT

A method of forming a semiconductor device is provided. The method includes forming a first fin above a substrate, forming a first emitter region in a first portion of the first fin, forming a first collector region in a second portion of the first fin, and forming a first base region in a third portion of the first fin. The third portion of the first fin is disposed underneath a first gate electrode. The method further includes forming a second fin adjacent to the first fin and above the substrate. The second fin is composed of a semiconductor material. The method also includes forming a first base contact over the second fin. The first base contact is coupled to the first base region through the second fin, the substrate, and the first fin.

20 Claims, 13 Drawing Sheets

METHODS OF FABRICATING BIPOLAR JUNCTION TRANSISTORS HAVING A FIN

This application is a continuation of U.S. patent application Ser. No. 12/618,425, filed on Nov. 13, 2009, now U.S. Pat. No. 8,258,602, entitled "Bipolar Junction Transistors and Methods of Fabrication Thereof," which claims the benefit of U.S. Provisional Application No. 61/147,980 filed on Jan. 28, 2009, entitled "Bipolar Junction Transistors and Methods of Fabrication Thereof," which applications are hereby incorporated herein by reference.

TECHNICAL FIELD

The present invention relates generally to semiconductor devices, and more particularly, to designs and methods of fabrication of bipolar junction transistors.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FINFETs) or multiple gate transistors will be used in sub 32 nm transistor nodes. For example, FINFETs not only improve areal density but also improve gate control of the channel.

Bipolar junction transistors (BJTs) and FETs require different structures and hence typically are fabricated using different fabrication processes. Merely adding a BJT process sequence to an FET process sequence results in an increase in the number of process steps, many of which are redundant. Further, if some of the BJT processes are different from the FET processes, they require separate development, thus increasing the process cost. Generally, in IC fabrication, it is desirable to reduce the total number of processing steps and use existing processes to avoid independent process development. Hence, to reduce costs, BJTs and FETs may be fabricated using a common process. However, such fabrication introduces a number of process and design challenges, especially with introduction of finfet devices.

Accordingly, what is needed in the art are BJTs whose formation processes are compatible with the formation of FinFETs while at the same time overcoming the deficiencies of the prior art.

SUMMARY OF THE INVENTION

These and other problems are generally solved or circumvented, and technical advantages are generally achieved, by embodiments of the present invention.

Embodiments of the invention include BJTs. In accordance with embodiments of the present invention, a semiconductor device includes a first fin comprising a first emitter region, a first base region, and a first collector region, wherein the first emitter region, the first base region, and the first collector region form a first BJT. A second fin is disposed adjacent and parallel to the first fin, the second fin comprising a contact to the first base region.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1d, illustrates a structural embodiment of a FIN BJT, wherein

FIG. 2, which includes FIGS. 2a and 2b, illustrates BJTs in accordance with an embodiment of the invention, wherein

FIG. 3, which includes FIGS. 3a and 3b, illustrates BJTs in accordance with an alternative embodiment of the invention, wherein

FIG. 4, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a multi gate bipolar device. The invention may also be applied, however, to contact formation in other technologies and multi gate devices.

While non-planar devices, such as multi gate devices or FINFET devices, have been offered for future technologies to mitigate problems with scaling planar CMOS technologies, such multiple gate designs create challenges in designing and forming other devices such as bipolar devices. Unlike planar technologies, where gate lengths and gate pitch can be substantially varied, the designs for non-planar devices offer little flexibility. For example, the fin height, width, and pitch are constant for a given technology due to the complexity of forming such a structure. Hence, the design space for FIN-FET devices is less flexible than the corresponding design space for planar devices.

The reduced flexibility of non-planar device designs creates challenges in designing other devices such as BJTs using a common non-planar CMOS flow. One of the challenges involves the formation of contacts to BJTs. For example, it is difficult to contact the base region of a BJT, without additional masking and/or process steps, without significant areal penalty, and without increase in parasitic resistances or capacitances.

In various embodiments, the present invention avoids extra mask steps by using masks commonly shared with a non-planar CMOS processes. Base contacts are fabricated without a significant area penalty, while minimizing resistance to the base region of the bipolar device.

A structural embodiment of a FIN BJT will be described using FIG. 1. Further, structural embodiments will be described using FIGS. 2-4. A method of fabrication of a FIN BJT will be described using FIGS. 5-10.

Figure 1A:
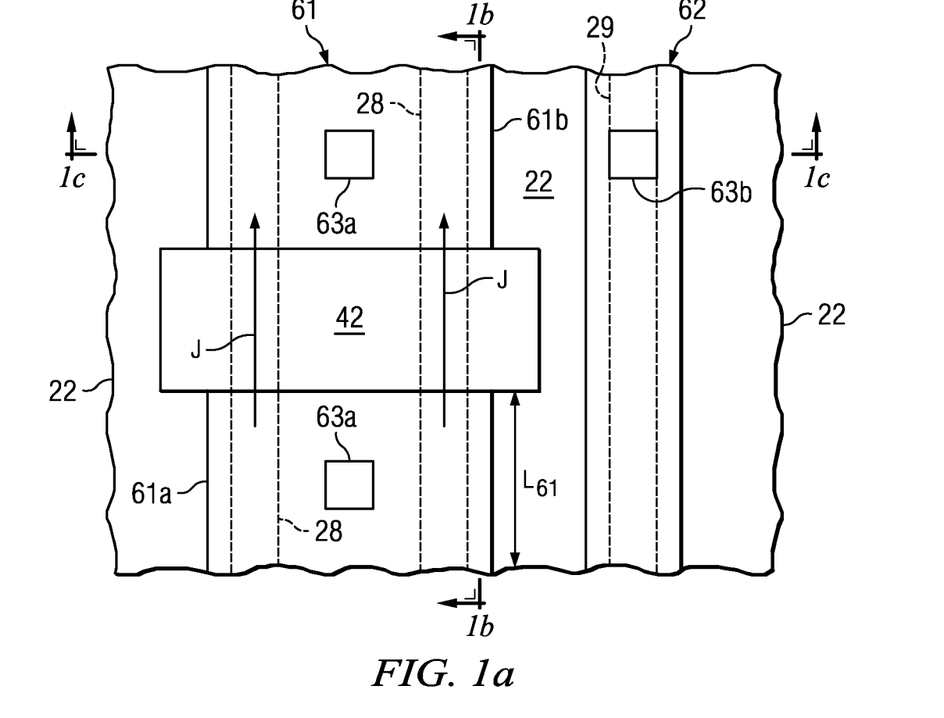
FIG. 1a illustrates a top view.
Figure 1B:
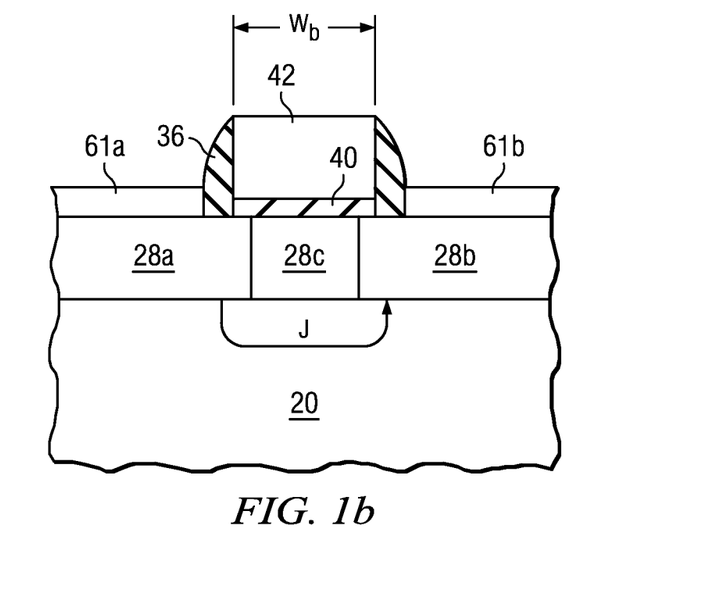
FIGS. 1b and 1c illustrate cross sectional views.
Figure 1C:
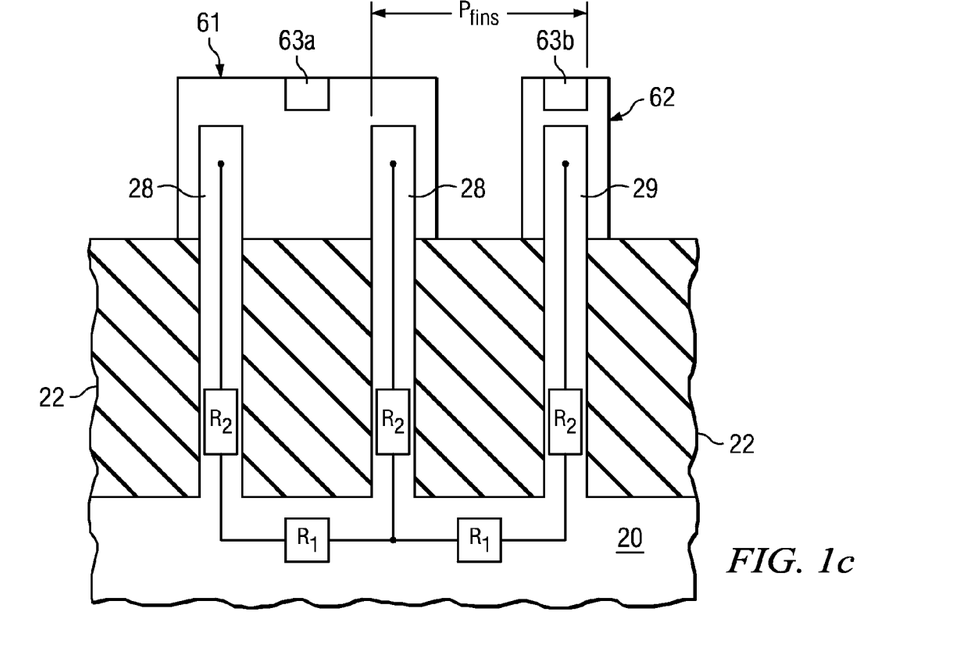
Figure 1D:
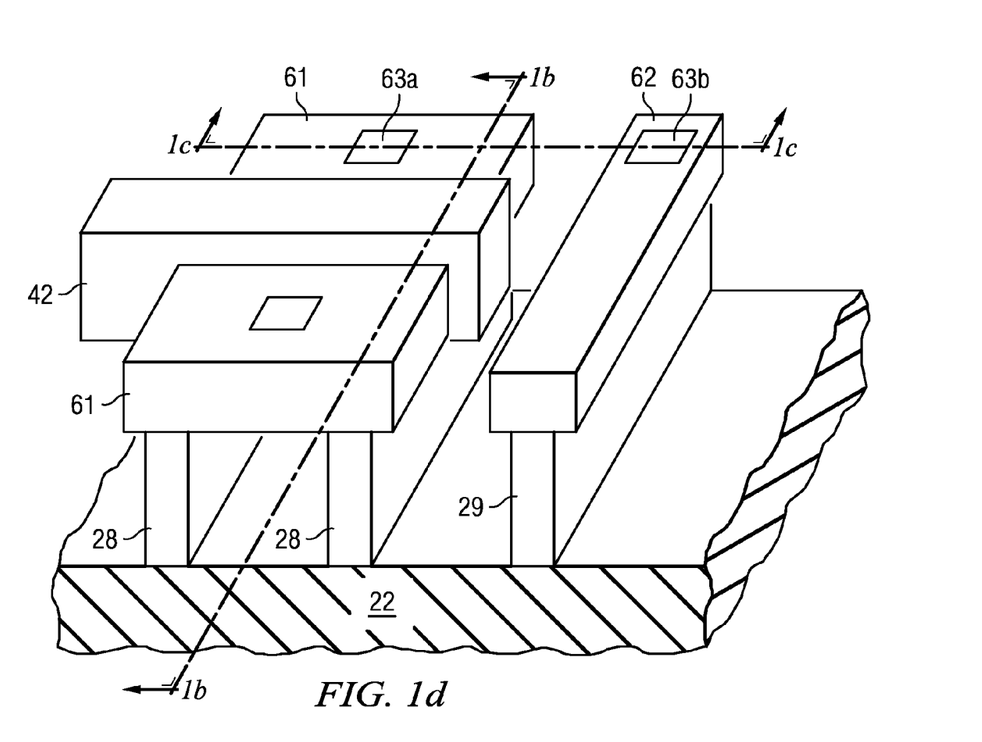
FIG. 1d illustrates a perspective view of the FIN BJT.

FIG. 1, which includes FIGS. 1a-1d, illustrates a structural embodiment of a FIN BJT. FIG. 1a illustrates a top view, whereas FIGS. 1b and 1c illustrate cross sectional views, and FIG. 1d illustrates a perspective view of the FIN BJT.

Referring to FIG. 1a, an emitter/collector region 61 comprising an emitter region 61a and a collector region 61b is disposed over adjacent first fins 28. The emitter region 61a and the collector region 61b are physically separated by a gate electrode 42.

A base contact region 62 is disposed above a second fin 29 and is isolated from an adjacent emitter/collector region 61 by a shallow trench isolation (STI) region 22. The emitter/collector contacts 63a and the base contact 63b are formed on the emitter/collector region 61 and the base contact region 62 respectively.

As illustrated in the cross sectional view of FIG. 1b, the emitter region 61a and the collector region 61b are physically separated by a gate dielectric 40 and a gate electrode 42. The emitter region 61a and the collector region 61b are electrically separated from the gate electrode 42 by gate spacers 36. In some embodiments, the gate electrode 42 is not floating but is rather electrically coupled to a fixed potential during operation and this fixed potential is not changed during the operation of the BJT. In various embodiments, the doping of the gate electrode 42 is similar to a corresponding field effect transistor. For example, in one embodiment, if the emitter and collector are n-type doped, the gate electrode 42 comprises a material with a work function close to the conduction band edge e.g. n-type polysilicon. Alternatively, if the emitter and collector are p-type doped, the gate electrode 42 comprises a material with a work function close to the valence band edge e.g. p-type polysilicon.

The first fins 28 are doped with the same conductivity as the emitter/collector region 61 in a first portion of the first fins 28a and a second portion of the first fins 28b. A third portion of the first fins 28c is disposed under the gate dielectric 40 and is doped opposite to the first portion of the first fins 28a. The first and the second portions of the first fins 28a and 28b comprise a similar doping as the emitter region 61a and the collector region 61b. Hence, the first portion of the first fins 28a form a part of the emitter of the BJT and the second portion of the first fins 28b form a part of the collector of the BJT. The third portion of the first fins 28c separates the first and the second portions of the first fins 28a and 28b and comprises a highly doped region of an opposite conductivity.

In some embodiments, the emitter of the BJT is doped to a higher doping concentration than the collector of the BJT. In various embodiments, the doping of the base region is lower than the doping of the emitter and the collector regions. The low doping of base region of the BJT minimizes electron-hole recombination, and maximizes the beta of the BJT because most of the charge emitted from the emitter passes through the base region with less recombination.

In various embodiments, while the first portion of the first fins 28a and the second portion of the first fins 28b form the emitter/collector region of the BJT, the source/drain region of FINFETs in the semiconductor device are also similarly formed and doped. Similarly, the emitter region 61a and the collector region 61b comprise a silicide conductor layer corresponding to a silicide contact region on corresponding FIN-FETs.

The BJT thus formed between the emitter region 61a through the substrate 20 (base region) and the collector region 61b. The current flow J during the bipolar device operation is shown by the arrow in FIG. 1b (the corresponding arrow is also shown in FIG. 1a). The base width of the bipolar transistor $W_b$ is governed by the gate length of the gate electrode 42 and hence tightly controlled in the process.

In one embodiment, an NPN BJT comprises a $n^+$ doped first portion of the first fins 28a, a $n^+$ doped second portion of the first fins 28b, and a p-type doped substrate 20. The emitter/collector region 61a is doped n-type and the base collector region 62 is doped with a p-type dopant. The third portion of the first fins 28c comprises a $p^+$ doping.

Alternatively, in another embodiment, a PNP BJT is formed if the emitter/collector region 61a is doped p-type and the base collector region 62 is doped with an n-type dopant. Additionally, the substrate 20 of the transistor underlying the gate electrode 42 is doped with an n-type dopant. The PNP BJT is compatible with a PMOS transistor process. If the substrate 20 comprises a p-type doping, the PMOS transistor is on n-well region enclosed by the p-type substrate. In this embodiment, the first portion of the first fins 28a comprises a $n^+$ doping and the second portion of the first fins 28b comprises an $n^+$ doping. In various embodiments, the $n^+$ doping or $p^+$ doping comprise a doping more than $1 \times 10^{19}$ cm$^{-3}$.

FIG. 1c illustrates a cross sectional view showing the coupling of the base region of the bipolar device (substrate 20 under the third portion of the first fins 28c in FIG. 1b) with the base contact region 62. The resistance between the base region of the bipolar device and the base contact region 62 is a combination of the first resistance $R_1$ and the second resistance $R_2$. The first resistance $R_1$ is determined by the distance between adjacent fins is a minimum distance. Using this embodiment, the total resistance $R_1+R_2$ is advantageously smaller than if the base contact region 62 is aligned perpendicular to the first fins 28. This is because if the base contact region 62 is aligned perpendicular to the first fins 28, the distance between the base contact region 62 and the base region (which is equal to a length of emitter/collector region $L_{61}$ (FIG. 1a) and an isolation region) is significantly larger than the distance between adjacent fins $P_{fins}$.

Figure 2A:
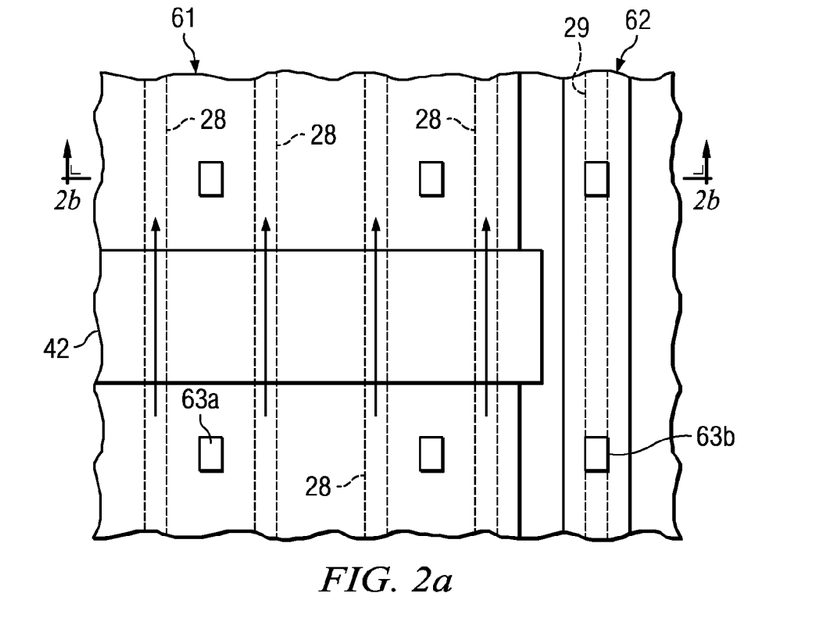
FIG. 2a illustrates a top view and FIG. 2b illustrates a cross sectional view of the emitter/collector region and the base contact region.
Figure 2B:
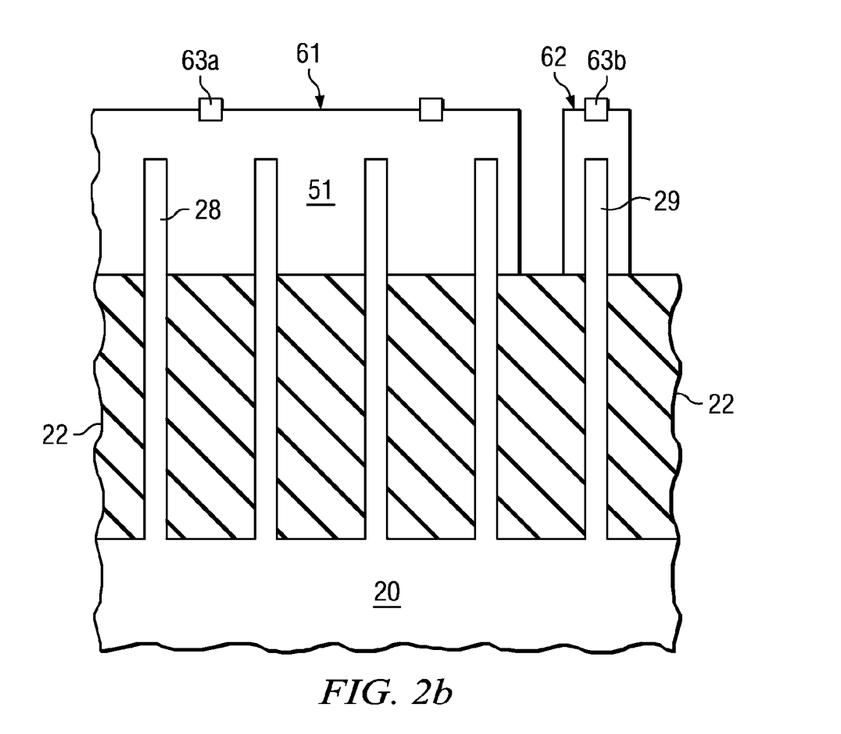

FIG. 2, which includes FIGS. 2a and 2b, illustrates BJTs in accordance with an embodiment of the invention, wherein FIG. 2a illustrates a top view and FIG. 2b illustrates a cross sectional view of the emitter/collector region and the base contact region.

Referring to FIG. 2a, a single base contact region 62 is used to couple a large BJT comprising multiple first fins 28. Arrows in FIG. 2a represent the current flow due to bipolar action. Hence, multiple BJTs are coupled in parallel between the commonly shared emitter/collector regions 61. The base region of each of the BJT is below the gate electrode 42. The base contact region 61 couples the base regions of the multiple BJTs.

As illustrated in FIG. 2b, the base contact region 62 couples the base of the bipolar transistor through the substrate 20. In particular, a single second fin 29 provides the base contact for a large number of first fins 28. Hence this embodiment enables high area efficiency because very little surface area (or foot print) of the substrate 20 is used in forming the base contacts. Both the emitter/collector region 61 and the base contact region 62 comprise a semiconductor material 51, but are oppositely doped.

Figure 3A:
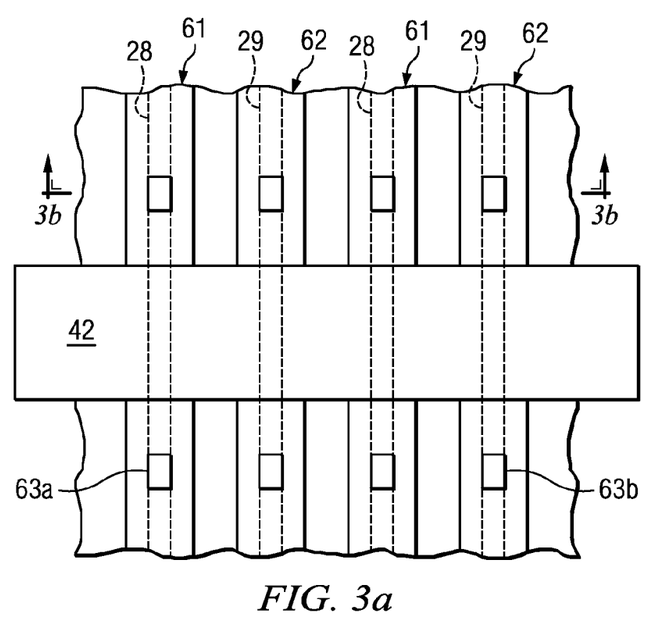
FIG. 3a illustrates a top view and FIG. 3b illustrates a cross sectional view of the emitter/collector region and the base contact region.
Figure 3B:
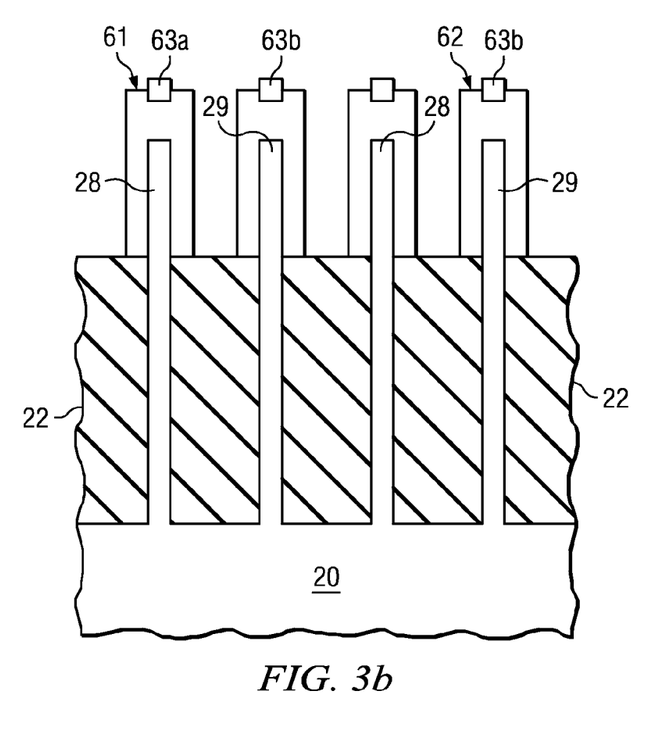

FIG. 3, which includes FIGS. 3a and 3b, illustrates BJTs in accordance with an alternative embodiment of the invention, wherein FIG. 3a illustrates a top view and FIG. 3b illustrates a cross sectional view of the emitter/collector region 61 and the base contact region 62.

Referring to FIG. 3a, the first fins 28 and the second fins 29 are formed alternately. Hence, each of the first fins 28 is surrounded by second fins 29 on either side. Thus providing the best performance by minimizing the base resistance. The base resistance is paralleled by the cross finger so that the base resistance is smaller than a BJT with a single base contact region.

Further, unlike FIG. 2, the gate electrode 42 is formed continuously, although in other embodiments, the gate electrode 42 may be discontinuous as shown in FIG. 2a. The presence of the gate electrode 42 over the second fins 29 does not form a transistor as the substrate 20 and a portion of the second fin 29 underlying the gate electrode 42 comprises the same conductivity type as the base contact region 62.

FIG. 4, which includes FIGS. 4a-4d, illustrates a layout or an array of BJTs in accordance with embodiments of the invention.

Figure 4A:
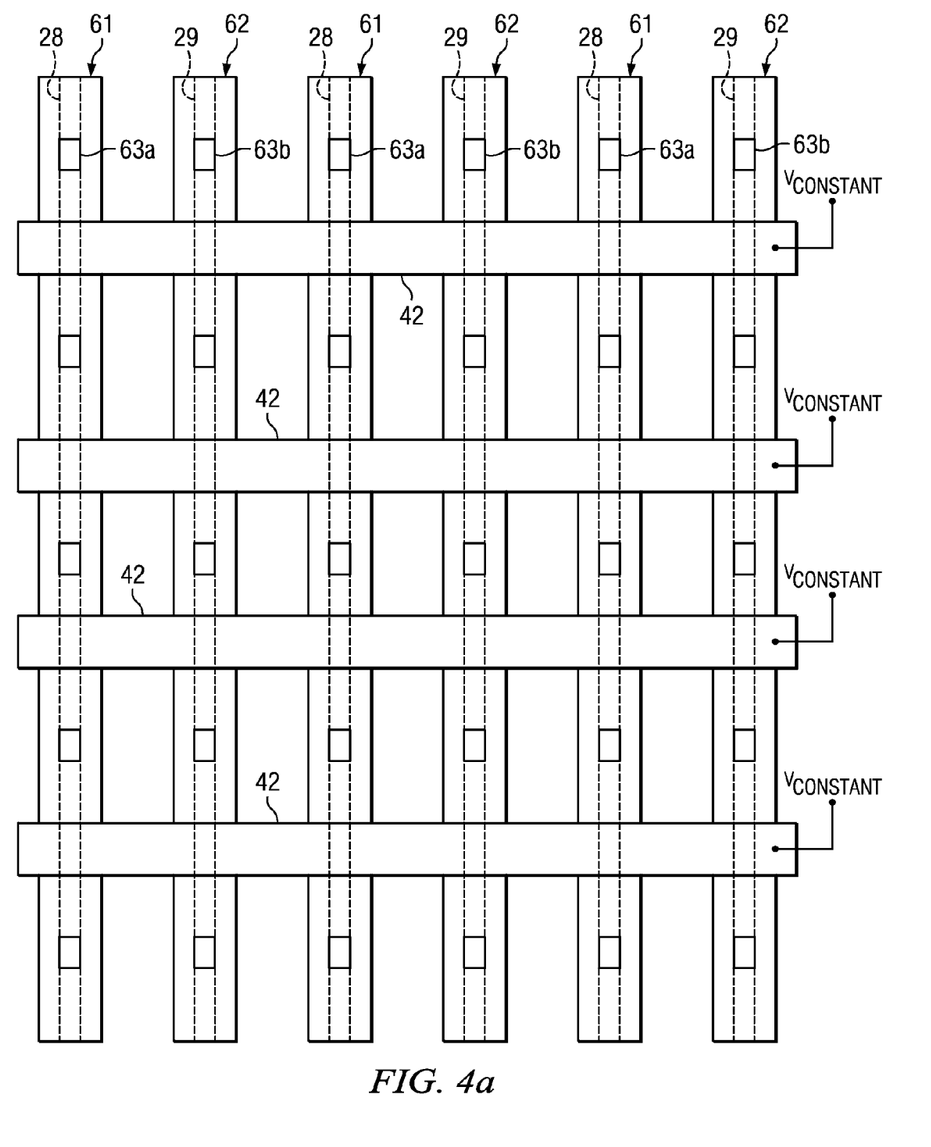
FIGS. 4a-4d, illustrates a layout, or an array, of BJTs in accordance with embodiments of the invention.

Referring to FIG. 4a, first fins 28 and second fins 29 are formed alternately. A continuous gate electrode 42 is formed separating the emitter/collector regions 61. The base contact regions 62 are formed adjacent to each emitter/collector region 61. Hence, an array of contacts alternating between the emitter/collector contacts 63a and the base contacts 63b are formed. Each of the gate electrodes 42 is coupled to a constant potential $V_{constant}$.

A NPN BJT array is formed if the emitter/collector region 61a is doped n-type and the base collector region 62 is doped with a p-type dopant. Alternatively, a PNP BJT is formed if the emitter/collector region 61a is doped with a p-type dopant and the base collector region 62 is doped with a n-type dopant. Additionally, the substrate 20 of the transistor underlying the gate electrode 42 is doped with an n-type dopant.

Figure 4B:
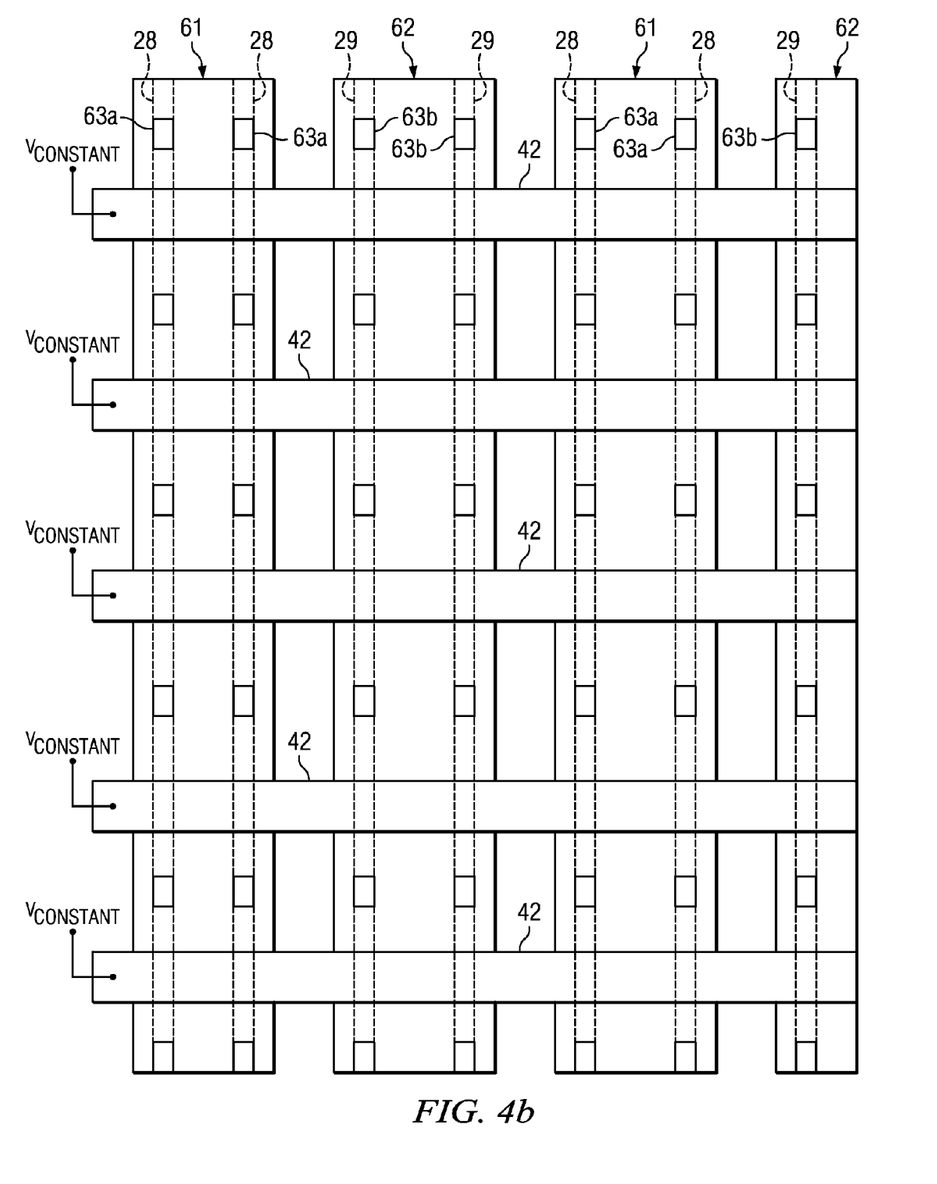

FIG. 4b illustrates an alternative embodiment showing two first fins 28 formed adjacent two second fins 29. Hence, in this embodiment, the emitter/collector region 61 is formed over two first fins 28, thus forming a larger emitter/collector region 61 than the embodiment shown in FIG. 4a. While this embodiment is not as advantageous in minimizing base resistance as the embodiment illustrated in FIG. 4a, the embodiment illustrated in FIG. 4b mitigates contact resistance and misalignment errors in forming emitter/collector contacts 63a, and hence may be desirable due to process limitations.

Figure 4C:
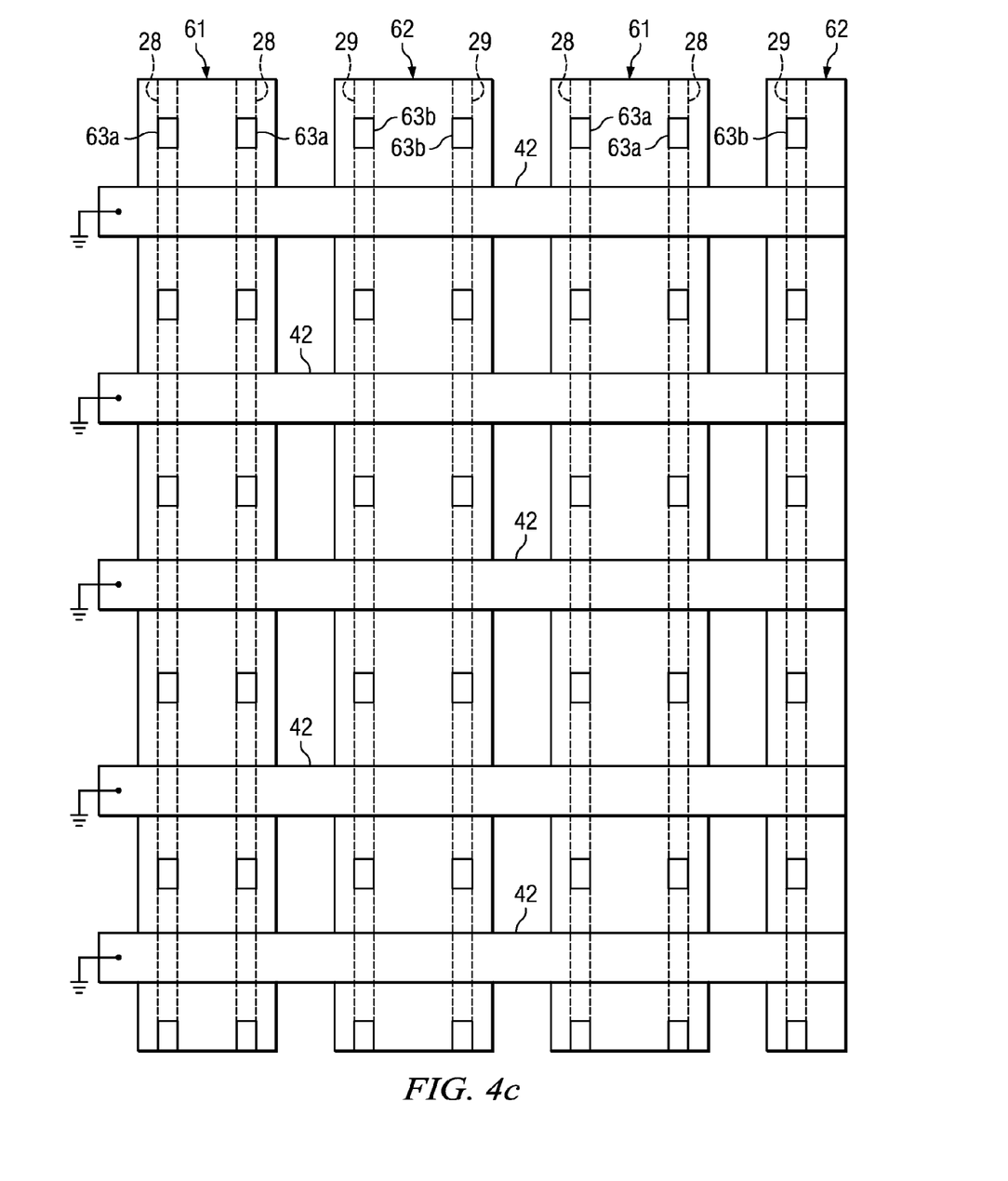
Figure 4D:
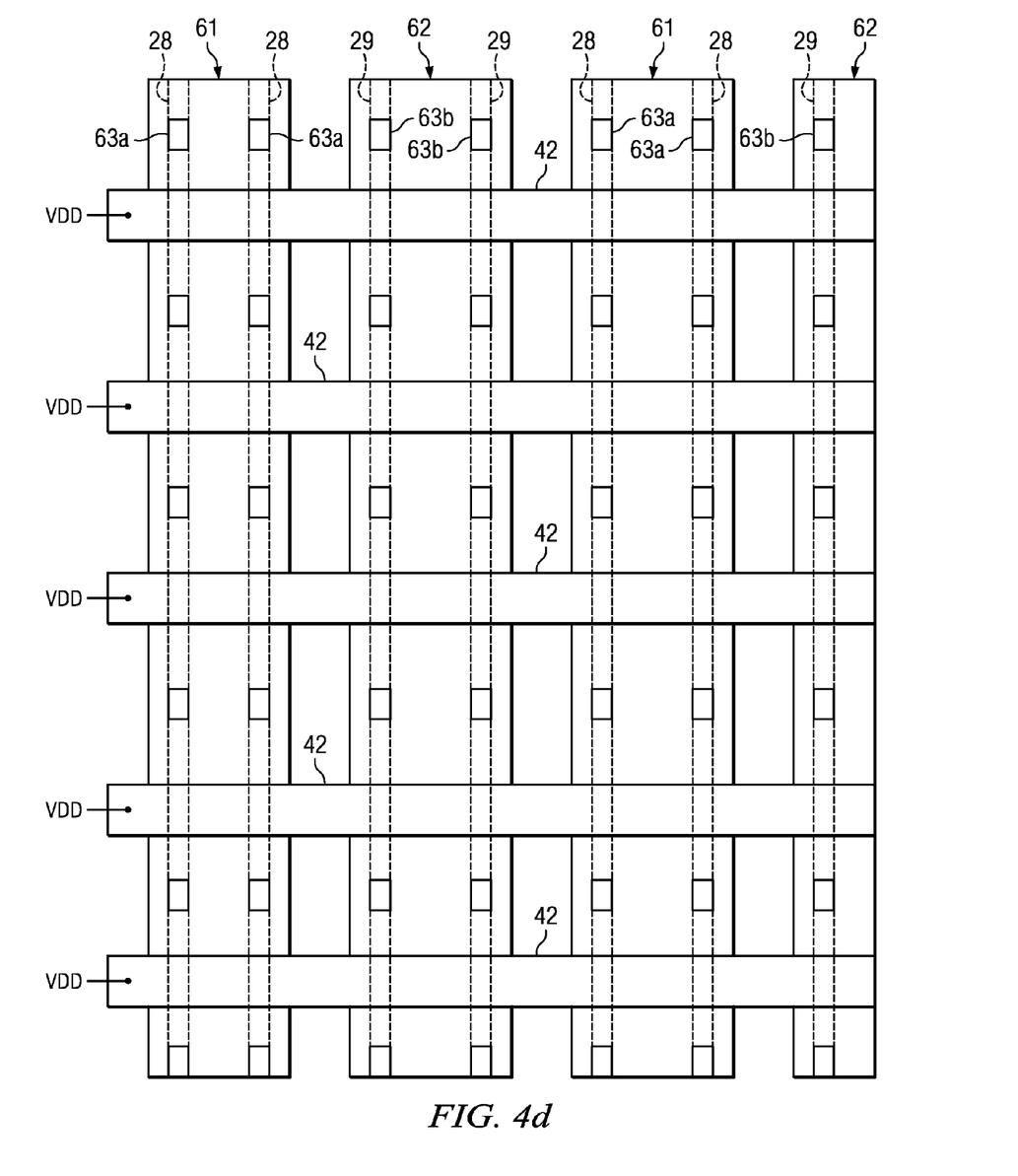

FIGS. 4c and 4d illustrate alternative embodiments of the layout shown in FIG. 4b forming a NPN transistor array (FIG. 4c) and a PNP transistor array (FIG. 4d). In FIG. 4c, the emitter/collector region 61 is doped with an n-type dopant, such as arsenic, phosphorus, and/or antimony, and the base collector region 62 is doped with a p-type dopant, such as boron or indium. Hence, the gate electrode 42 is coupled to a ground potential.

Referring to FIG. 4d, the emitter/collector region 61 is doped with a p-type dopant, such as boron or indium, and the base collector region 62 is doped with an n-type dopant, such as arsenic, phosphorus, and/or antimony. Hence, the gate electrode 42 is tied to a positive potential, for example, VDD.

FIGS. 5-10 illustrate a FIN BJT in various stages of fabrication in accordance with embodiments of the invention.

Figure 5:
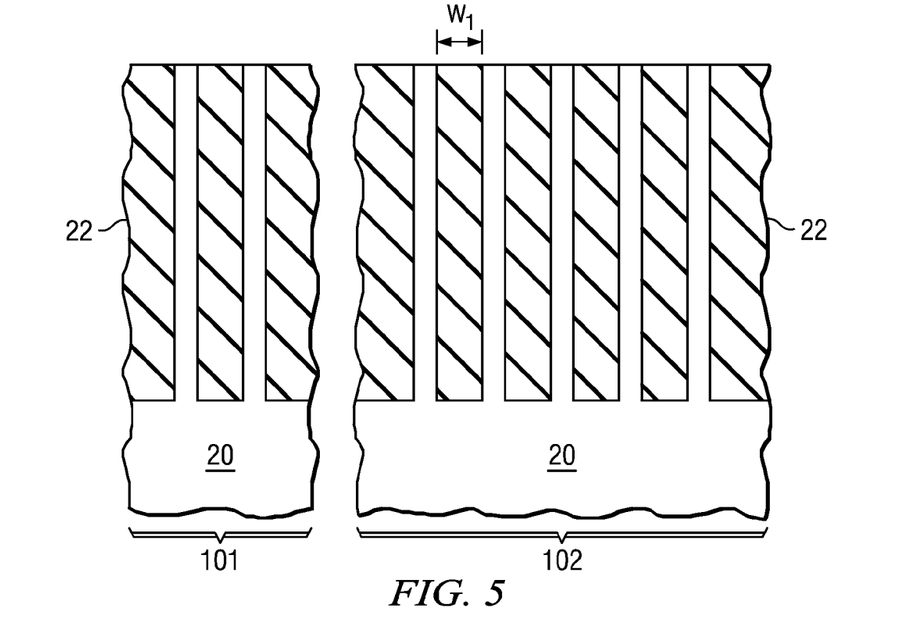
FIGS. 5-10 illustrate a FIN BJT in various stages of fabrication in accordance with embodiments of the invention.

FIG. 5 illustrates a cross-sectional view of substrate 20, which includes a FET region 101 and a BJT region 102. The FET region 101 may be a core circuit region, an input/output (IO) device region, or the like. The BJT region 102 is used for forming, e.g., an analog component or a high performance discrete circuit. While in this embodiment both FETs and BJTs are fabricated together, in some embodiments, only the BJTs may be present and field effects transistors may be absent. In such embodiments, the FET region 101 may be omitted.

In some embodiments, the substrate 20 comprises bulk silicon. Alternatively, substrate 20 comprises bulk silicon germanium (SiGe) or other semiconductor materials. Substrate 20 may be doped with a p-type or an n-type impurity, depending on the types of the resulting FinFET and bipolar device.

Referring to FIG. 5, STI regions 22 are formed on substrate 20. As is known in the art, STI regions 22 may be formed by etching substrate 20 to form recesses, and then filling the recesses with dielectric materials, such as high-density plasma (HDP) oxides, TEOS oxides, or the like. The width $W_1$ of STI regions 22 may be less than about 100 nm. One skilled in the art will realize, however, that the dimensions recited throughout the description are merely examples, and will change if different formation technologies and/or technology nodes are used.

Figure 6A:
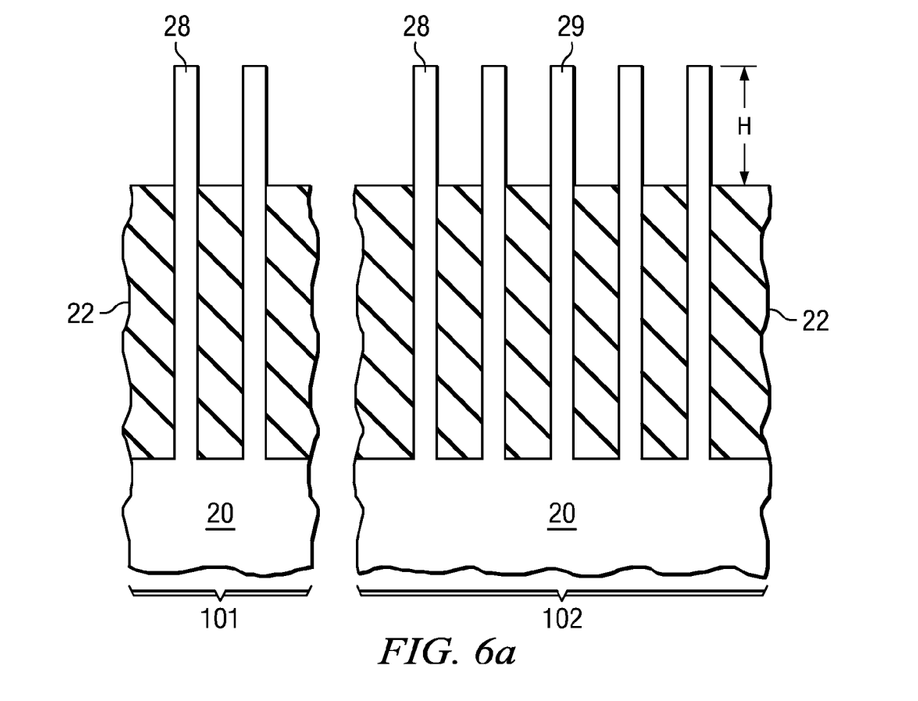
Figure 6B:
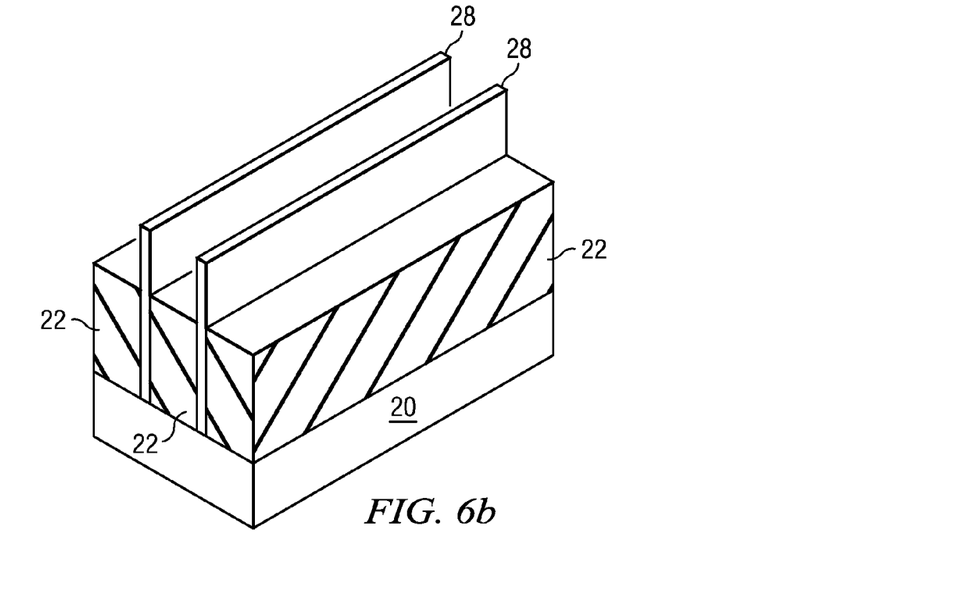
Figure 6C:
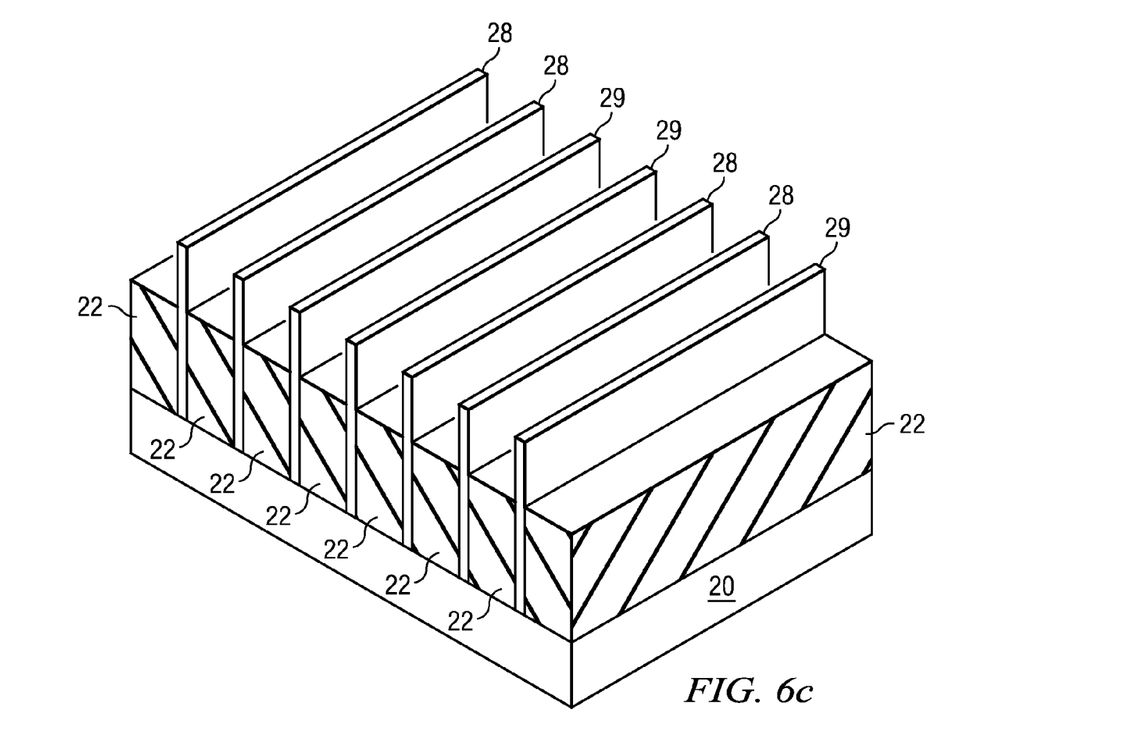

FIG. 6, which includes 6a-6c, illustrates the FET region 101 and the BJT region 102 after forming fins.

FIG. 6a is a cross-sectional view, while FIG. 6b is a perspective view of the FET region shown in FIG. 6a, and FIG. 6c illustrates a perspective view of the bipolar device region shown in FIG. 6a. First and second fins 28 and 29 may be formed by recessing the top surfaces of STI regions 22, and hence leaving the first and the second fins 28 and 29. Alternatively, the first and the second fins 28 and 29 are epitaxially grown from the semiconductor strips between the STI regions 22. In one embodiment, a height H of first and second fins 28 and 29 is between about 20 nm and about 100 nm, and a ratio of height H to width $W_1$ is between about 1 and about 10. The first and the second fins 28 and 29 are implanted to dope the base region of the FIN BJT or the channel region of the FINFET that is being fabricated, in one embodiment. The base region of the FIN BJT is doped by a blanket implant and the emitter and collector regions are subsequently doped after forming a gate stack (as described below) in one embodiment. In an alternative embodiment, the emitter and collector regions of the FIN BJT are doped using a blanket implant followed by a counter doping implant (performed later) to dope the base region of the FIN BJT. In one embodiment, if a NPN FIN BJT is to be formed, the first and the second fins 28 and 29 are implanted with an n-type dopant such as arsenic. In one embodiment, if a PNP FIN BJT is to be formed, the first and the second fins 28 and 29 are implanted with a p-type dopant such as boron. A sequence of large angled implants is performed to dope the first and the second fins 28 and 29 with a uniform concentration on the surface of the fin sidewalls.

Figure 7A:
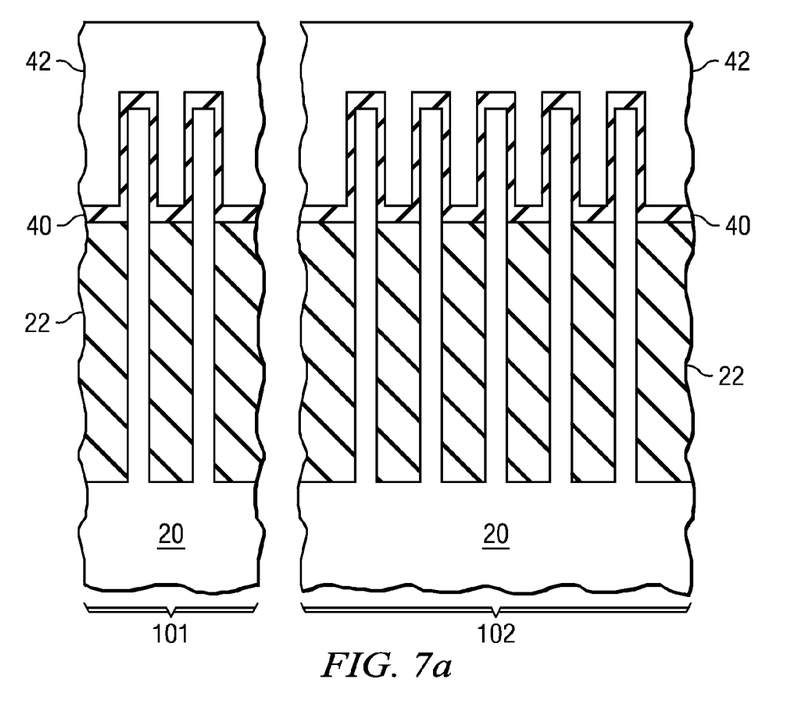
Figure 7B:
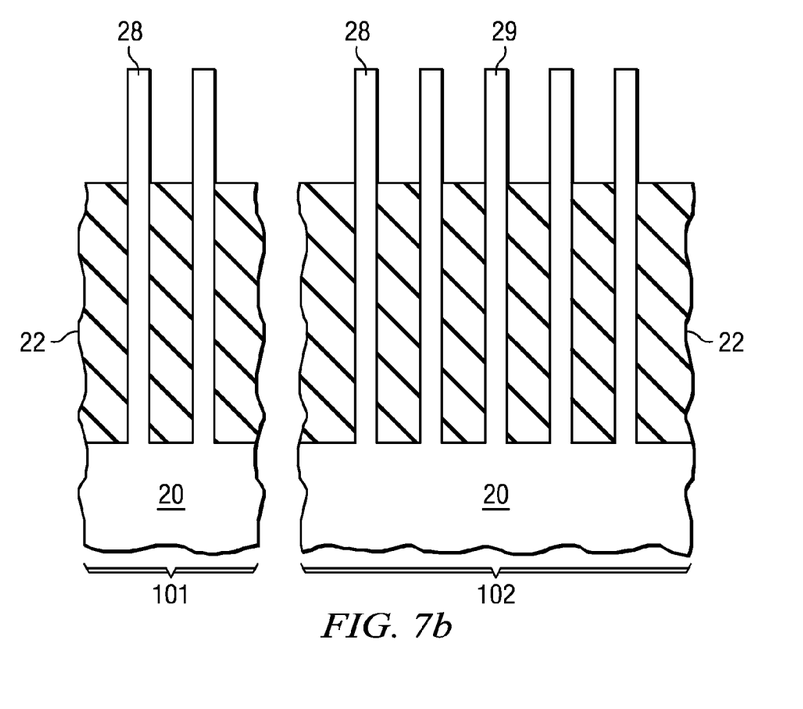
Figure 7C:
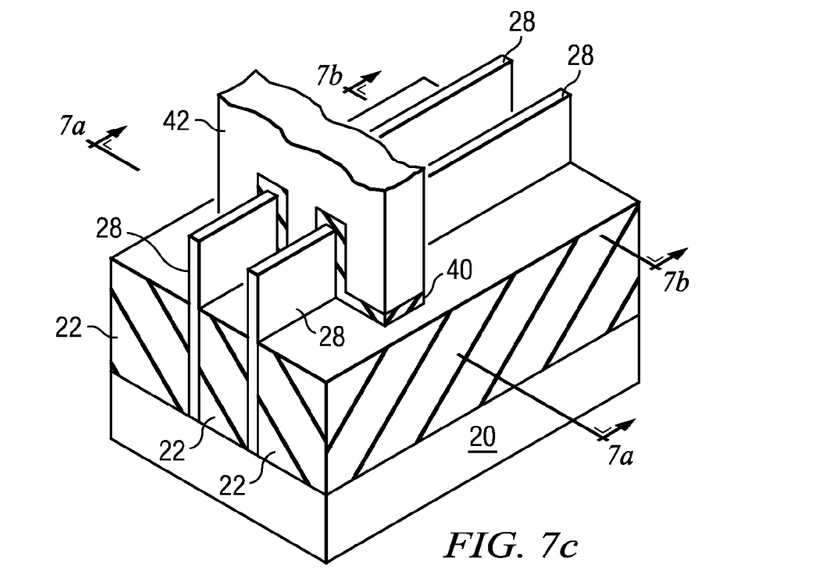

Referring to FIG. 7, a gate dielectric 40 and a gate electrode 42 are deposited and patterned. FIG. 7c illustrates a perspective view of the FET region 101, while FIGS. 7a and 7b illustrate cross sectional views. FIG. 7a illustrates a cross sectional view showing the formation of the gate stack, while FIG. 7b illustrates a cross sectional view of the source/drain region (to be formed) of the FET region 101 and collector/emitter region (to be formed) for the BJT region 102. The perspective view of the BJT region 102 is similar to that of the FET region shown in FIG. 7c.

The gate dielectric 40 may include commonly used dielectric materials such as oxides, nitrides, oxynitrides, high-K dielectrics such as $Ta_2O_5$, $Al_2O_3$, HfO, $Ta_2O_5$, $SiTiO_3$, HfSiO, HfSiON, ZrSiON, and combinations thereof. The gate electrode layer 42 is formed on the gate dielectric 40, and may be formed of polysilicon in one embodiment. Alternatively, the gate electrode 42 may be formed of other commonly used conductive materials, including metals such as Ni, Ti, Ta, Hf, and combinations thereof, metal silicides such as NiSi, MoSi, HfSi, and combinations thereof, and metal nitrides such as TiN, TaN, HfN, HfAlN, MoN, NiAlN, and combinations thereof. Next, gate spacers (not shown) are formed on the sidewalls of the gate dielectric 40 and the gate electrode 42, while no gate spacers are formed on the sidewalls of the fins 28. An extension implant may optionally be performed to dope the exposed portions of the first and the second fins 28 and 29. The extension implant is a large angled low energy implant in one embodiment. The extension implant dopes the exposed portions of the first and the second fins 28 and 29 with a n-type doping if a NPN FIN BJT is being formed, or a p-type doping if a PNP FIN BJT is being formed. An angled or tilted halo implant may be optionally performed as a sequence of multiple rotations. For example, a counter doping implant at an implant angle greater than 45° with respect to the vertical axis in rotations of 45, 135, 225, and 315 with respect to the gate electrode 42 may be performed in one embodiment.

Figure 8:
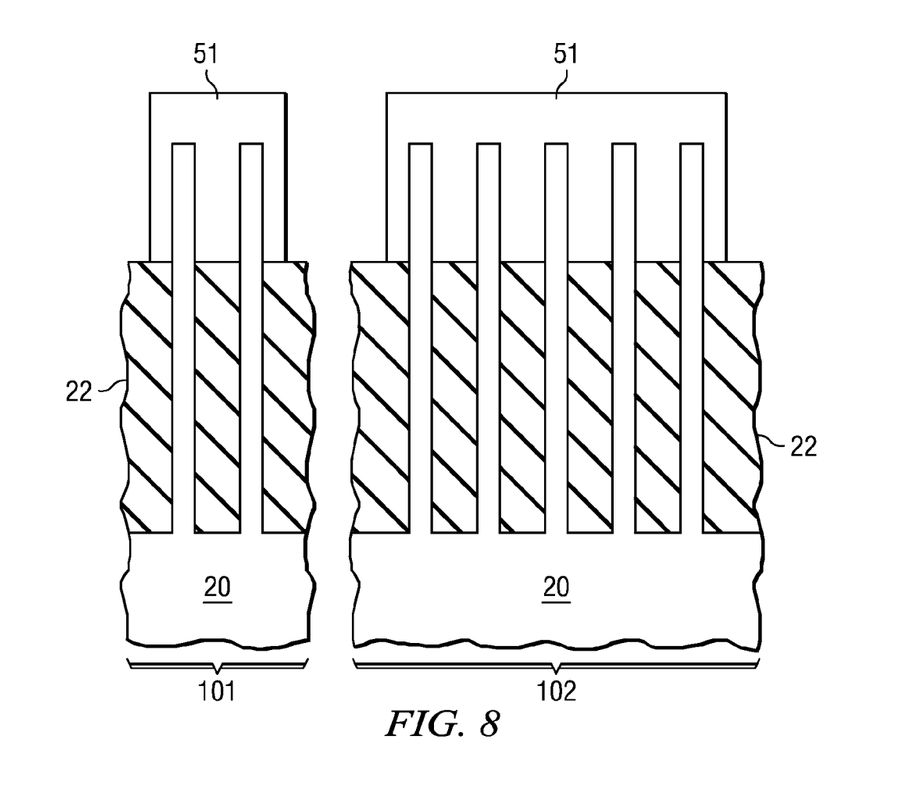

Referring to FIG. 8, a selective epitaxial growth is performed to form semiconductor material 51. The semiconductor material 51 will form the future source/drain in the FET region 101. In the BJT region 102, the semiconductor material 51 forms the emitter/collector regions as well as the contact region for the base region of the BJTs.

In an embodiment, the semiconductor material 51 is formed of the same material as the substrate 20, and is epitaxially grown on the fins 28. In alternative embodiments, semiconductor material 51 is formed of a material different from that of substrate 20, for example, silicon germanium (SiGe), silicon carbon (SiC) etc.

The epitaxial growth includes vertical growth and horizontal growth, and the portion of semiconductor material 51 grown from one of the fins 28 eventually joins the portion of semiconductor material 51 grown from a neighboring first fin 28. As shown in FIG. 8, the epitaxially grown semiconductor material 51 forms a continuous region. Being a selective epitaxial deposition process, the semiconductor material 51 is not grown on the gate dielectric 40 and the gate electrode 42 during the growth.

During the growth of semiconductor material 51, a p-type impurity or an n-type impurity may be in-situ doped, and hence the resulting semiconductor material 51 may be of p-type or n-type. The impurity concentration of semiconductor material 51 may be between about $1 \times 10^{15}/cm^3$ and about $5 \times 10^{20}/cm^3$.

Figure 9:
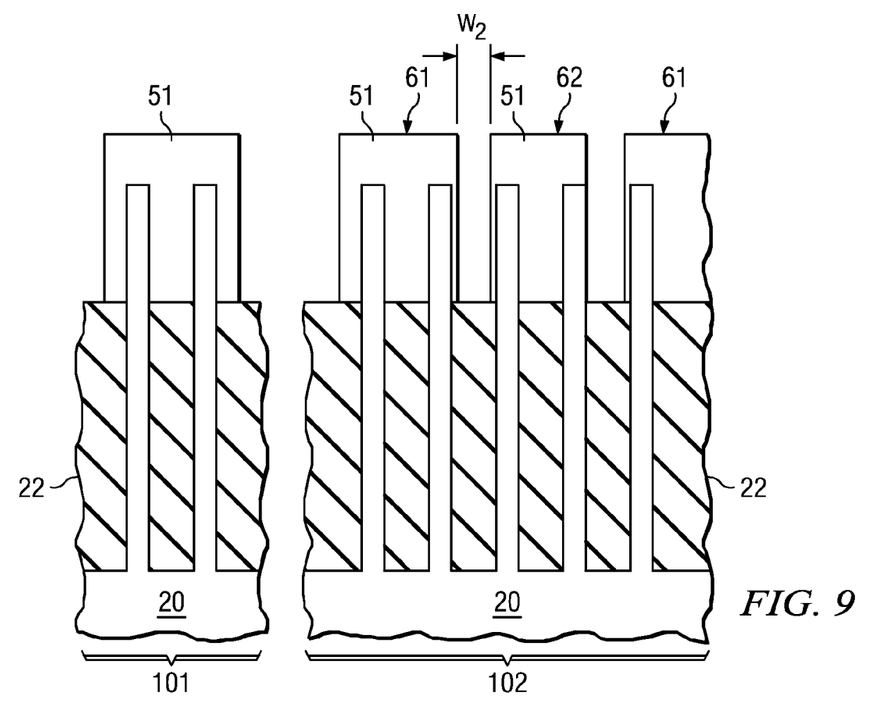

The semiconductor material 51 in the BJT region 102 is patterned as illustrated in FIG. 9 to separate the base contact region 62 with the emitter/collector region 61. In some embodiments, the separation $W_2$ between the first fins 28 forming the emitter/collector region 61 and the first fins 28 forming the base contact region may be increased to avoid forming a continuous semiconductor region 51, and thus forming the structure shown in FIG. 9 without an additional masking step. Alternatively, the separation $W_2$ may be increased, for example, by skipping the patterning of an adjacent fin.

The semiconductor material 51 in the FET region 101, and the BJT region 102 are doped by implantation and annealing. The BJT region 102 is masked and implanted such that the base contact region 62 is implanted with an opposite conductivity than the emitter/collector region 61. In one embodiment, the emitter/collector region 61 is implanted with an n-type doping whereas the base contact region 61 is implanted with p-type doping.

Figure 10:
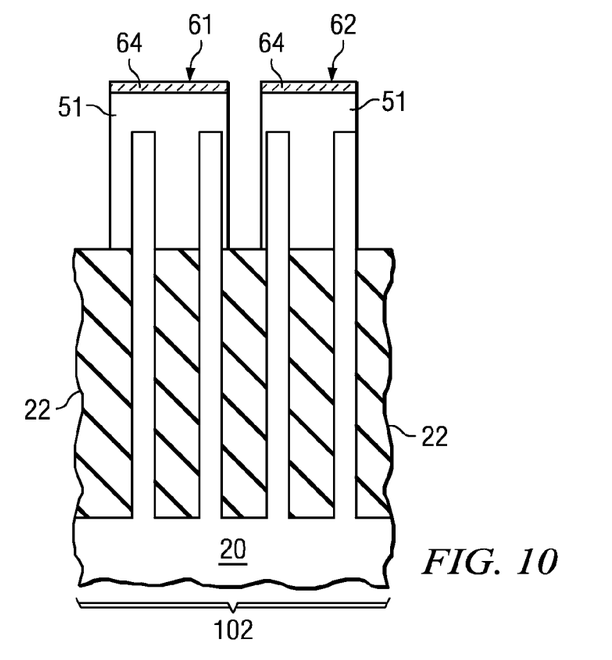

After forming suitable spacers, a silicide region 64 is formed over the top surface of the semiconductor region 51 (FIG. 10). Contacts (not shown) are subsequently formed and subsequent processing including metallization is performed. The top view of the bipolar device thus formed in the BJT region 102 conforms to the layout shown in FIG. 4b.

As described above all of the bipolar device fabrication processes are commonly shared with the FET transistors. Hence, in various embodiments, additional masking steps and/or process steps and development is avoided, thus advantageously forming bipolar devices are reduced cost.

While the embodiment described above in FIGS. 5-10 illustrated the fabrication of a device with two first fins 28 formed adjacent two second fins 29, in various embodiments, any other suitable combination is possible. For example, in one embodiment, the process described forms two first fins 28 adjacent a single second fin as illustrated in FIG. 1.

In an embodiment, a method of forming a semiconductor device is provided. The method includes forming a first fin above a substrate, forming a first emitter region in a first portion of the first fin, forming a first collector region in a second portion of the first fin, forming a first base region in a third portion of the first fin, the third portion of the first fin disposed underneath a first gate electrode, forming a second fin adjacent to the first fin and above the substrate, the second fin composed of a semiconductor material, forming a first base contact over the second fin, the first base contact being coupled to the first base region through the second fin, the substrate, and the first fin.

In an embodiment, a method of forming a semiconductor device is provided. The method includes forming a first fin comprising a first emitter region, a first base region, and a first collector region, wherein the first emitter region is horizontally adjacent to the first collector region and the first emitter region, the first base region, and the first collector region form a first bipolar junction transistor, and forming a second fin adjacent and parallel to the first fin, the second fin comprising a first contact to the first base region.

In an embodiment, a method of forming a semiconductor device is provided. The method includes forming a first fin, a second fin, and a third fin adjacent and parallel to each other over a substrate, the first fin being disposed between the second fin and the third fin, forming a first emitter region, a first base region, and a first collector region in the first fin, wherein the first emitter region, the first base region, and the first collector region form a first bipolar junction transistor, forming a second emitter region, a second base region, and a second collector region in the first fin, the first collector region and the second emitter region sharing a common region of the first fin, wherein the second emitter region, the second base region, and the second collector region form a second bipolar junction transistor, forming a third emitter region, a third base region, and a third collector region in the third fin, wherein the third emitter region, the third base region, and the third collector region form a third bipolar junction transistor, and forming a first and a second contact on the second fin, the first contact being coupled to the first and the third base regions, and the second contact being coupled to the second base region.

While embodiments of the invention described above share a common process with MOS devices, other embodiments may share process steps with other types of devices.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, comprising:
    forming a first fin above a substrate;
    forming a first emitter region in a first portion of the first fin;
    forming a first collector region in a second portion of the first fin, the first collector region horizontally adjacent to the first emitter region;
    forming a first base region in a third portion of the first fin, the third portion of the first fin disposed underneath a first gate electrode;
    forming a second fin adjacent to the first fin and above the substrate, the second fin composed of a semiconductor material;
    forming a first base contact over the second fin, the first base contact being coupled to the first base region through the second fin, the substrate, and the first fin.

2. The method of claim 1, further comprising forming a bipolar junction transistor with the emitter region, the collector region, and the base region, and coupling the first gate electrode to a node coupled to a fixed potential, and wherein the substrate comprises a semiconductor substrate.

3. The method of claim 1, further comprising:
    forming a third fin adjacent the first fin;
    forming a second emitter region in a first portion of the third fin;
    forming a common emitter region on the first and the second emitter regions;
    forming a second collector region in a second portion of the third fin;
    forming a common collector region on the first and the second collector regions;
    forming a second base region in a third portion of the third fin, the third portion of the third fin disposed underneath the first gate electrode.

4. The method of claim 3, wherein the common emitter region comprises a semiconductor material and electrically couples the first emitter region and the second emitter region, and wherein the common collector region comprises the semiconductor material and electrically couples the first collector region and the second collector region.

5. The method of claim 3, wherein the second base region is coupled to the first base contact through the second and the third fin and the substrate.

6. The method of claim 3, further comprising:
    forming a fourth fin adjacent the second fin;
    forming a base contact region above the second fin and the fourth fin, the fourth fin being electrically coupled to the second fin through the base contact region.

7. The method of claim 6, further comprising disposing the first base contact on the base contact region.

8. The method of claim 1, further comprising:
    forming a plurality of third fins adjacent the first fin;
    forming a plurality of second emitter regions in respective first portions of the plurality of third fins;
    forming a common emitter region on the first emitter region and the plurality of second emitter regions;
    forming a plurality of second collector regions in respective second portions of the plurality of third fins;
    forming a common collector region on the first collector region and the plurality of second collector regions; and
    forming a plurality of second base regions in respective third portions of the plurality of third fins, the third portions of the plurality of third fins disposed underneath the first gate electrode.

9. The method of claim 8, further comprising coupling the plurality of second base regions to the first base contact through the substrate and the second fin.

10. The method of claim 1, further comprising:
    forming a third fin adjacent the second fin, wherein the second fin is arranged between the first and the third fin;
    forming a second emitter region in a first portion of the third fin;
    forming a second collector region in a second portion of the third fin; and
    forming a second base region in a third portion of the third fin, the third portion of the third fin disposed underneath the first gate electrode.

11. The method of claim 1, further comprising:
    forming a third fin adjacent the first fin and above the substrate, wherein the first fin is arranged between the second and the third fin; and
    forming a second base contact over the third fin, the second base contact being coupled to the first base region through the first and the third fin and the substrate.

12. The method of claim 1, further comprising:
    forming a second emitter region in the second portion of the first fin;
    forming a second collector region in a fourth portion of the first fin;
    forming a second base region in a fifth portion of the first fin, the fifth portion of the first fin disposed underneath a second gate electrode; and
    forming a second base contact over the second fin, wherein the second base region is coupled to the second base contact through the first fin, the substrate and the second fin.

13. The method of claim 1, wherein the first collector region and the first emitter region comprise a n-type doping, and the first base region comprises a p-type doping.

14. The method of claim 1, wherein the first collector region and the first emitter region comprise a p-type doping, and the first base region comprises a n-type doping.

15. A method of forming a semiconductor device, comprising:
  forming a first fin comprising a first emitter region, a first base region, and a first collector region, wherein the first emitter region is horizontally adjacent to the first collector region and the first emitter region, the first base region, and the first collector region form a first bipolar junction transistor; and
  forming a second fin adjacent and parallel to the first fin, the second fin comprising a first contact to the first base region.

16. The method of claim 15, further comprising laterally separating the first emitter region, and the first collector region by a first highly doped region of an opposite type, and wherein the first base region is disposed below the first highly doped region.

17. The method of claim 15, further comprising disposing a first gate electrode above the first base region, the first gate electrode being perpendicular to the first and the second fins, and coupled to a fixed potential node.

18. The method of claim 15, further comprising:
  forming a second bipolar junction transistor comprising a second emitter region, a second base region, and a second collector region in the first fin, the first collector region and the second emitter region sharing a common region of the first fin; and
  coupling a second contact to the second base region and the second fin.

19. The method of claim 18, further comprising:
  forming a third fin comprising a third emitter region, a third base region, and a third collector region, wherein the third emitter region, the third base region, and the third collector region form a third bipolar junction transistor, and coupling the third bipolar junction transistor and the first bipolar junction transistor in parallel.

20. A method of forming a semiconductor device, comprising:
  forming a first fin, a second fin, and a third fin adjacent and parallel to each other over a substrate, the first fin being disposed between the second fin and the third fin;
  forming a first emitter region, a first base region, and a first collector region in the first fin, wherein the first emitter region, the first base region, and the first collector region form a first bipolar junction transistor;
  forming a second emitter region, a second base region, and a second collector region in the first fin, the first collector region and the second emitter region sharing a common region of the first fin, wherein the second emitter region, the second base region, and the second collector region form a second bipolar junction transistor;
  forming a third emitter region, a third base region, and a third collector region in the third fin, wherein the third emitter region, the third base region, and the third collector region form a third bipolar junction transistor; and
  forming a first and a second contact on the second fin, the first contact being coupled to the first and the third base regions, and the second contact being coupled to the second base region.

* * * * *